United States Patent
Lu et al.

(10) Patent No.: US 7,422,968 B2
(45) Date of Patent: Sep. 9, 2008

(54) METHOD FOR MANUFACTURING A SEMICONDUCTOR DEVICE HAVING SILICIDED REGIONS

(75) Inventors: Jiong-Ping Lu, Richardson, TX (US); Clint Montgomery, Coppell, TX (US); Lindsey Hall, Plano, TX (US); Donald Miles, Plano, TX (US); Duofeng Yue, Plano, TX (US); Thomas D. Bonifiield, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/901,756

(22) Filed: Jul. 29, 2004

(65) Prior Publication Data

US 2006/0024882 A1   Feb. 2, 2006

(51) Int. Cl.
*H01L 21/425* (2006.01)

(52) U.S. Cl. ................. 438/528; 438/592; 257/E21.165

(58) Field of Classification Search ................. 438/581, 438/407, 592, 651, 528; 257/377, E21.165
See application file for complete search history.

(56) References Cited

U.S. PATENT DOCUMENTS

| | | | | |
|---|---|---|---|---|
| 5,685,941 A * | 11/1997 | Forster et al. | ........... | 156/345.48 |
| 5,807,770 A * | 9/1998 | Mineji | ........... | 438/151 |
| 5,866,451 A * | 2/1999 | Yoo et al. | ........... | 438/241 |
| 5,885,861 A * | 3/1999 | Gardner et al. | ........... | 438/231 |
| 5,895,245 A * | 4/1999 | Harvey et al. | ........... | 438/305 |
| 5,950,098 A * | 9/1999 | Oda et al. | ........... | 438/527 |
| 6,248,637 B1 * | 6/2001 | Yu | ........... | 438/300 |
| 6,300,664 B1 * | 10/2001 | Kuroi et al. | ........... | 257/410 |
| 6,534,390 B1 * | 3/2003 | Chong et al. | ........... | 438/592 |
| 6,740,570 B2 * | 5/2004 | Chen et al. | ........... | 438/528 |
| 6,884,736 B2 * | 4/2005 | Wu et al. | ........... | 438/740 |
| 6,902,966 B2 * | 6/2005 | Yu et al. | ........... | 438/197 |
| 6,911,384 B2 * | 6/2005 | Dokumaci et al. | ........... | 438/592 |
| 2001/0045605 A1 * | 11/2001 | Miyashita et al. | ........... | 257/382 |
| 2002/0168828 A1 * | 11/2002 | Cheng et al. | ........... | 438/303 |
| 2003/0068866 A1 * | 4/2003 | Chen et al. | ........... | 438/299 |
| 2003/0080352 A1 * | 5/2003 | Chang et al. | ........... | 257/200 |
| 2003/0092273 A1 * | 5/2003 | Downey et al. | ........... | 438/694 |
| 2003/0203562 A1 * | 10/2003 | Uchida | ........... | 438/227 |
| 2004/0183220 A1 * | 9/2004 | Dalmia | ........... | 264/2.5 |

* cited by examiner

*Primary Examiner*—Chandra Chaudhari
(74) *Attorney, Agent, or Firm*—Frederick J. Telecky, Jr.; Wade J. Brady, III

(57) ABSTRACT

The present invention provides a method for manufacturing a semiconductor device, and a method for manufacturing an integrated circuit including the semiconductor devices. The method for manufacturing a semiconductor device (100), among other steps, includes forming a gate structure (120) over a substrate (110) and forming source/drain regions (190) in the substrate (110) proximate the gate structure (120). The method further includes subjecting the gate structure (120) and substrate (110) to a dry etch process and placing fluorine in the source/drain regions to form fluorinated source/drains (320) subsequent to subjecting the gate structure (120) and substrate (110) to the dry etch process. Thereafter, the method includes forming metal silicide regions (510, 520) in the gate structure (120) and the fluorinated source/drains (320).

20 Claims, 7 Drawing Sheets

METHOD FOR MANUFACTURING A SEMICONDUCTOR DEVICE HAVING SILICIDED REGIONS

TECHNICAL FIELD OF THE INVENTION

The present invention is directed, in general, to a method for manufacturing a semiconductor device, and, more specifically, to a method for manufacturing a semiconductor device having silicided gate electrode layer regions and silicided source/drain regions and a method for manufacturing an integrated circuit including the same.

BACKGROUND OF THE INVENTION

Conventional metal-oxide-semiconductor (MOS) transistors often use metal silicide layers to reduce resistance. A self aligned silicidation process (salicide) is often used to form the region of titanium, cobalt or tungsten silicide on the gate electrode and source/drain regions of the MOS transistor. In this process, a blanket metal film is deposited on the silicon substrate containing the MOS transistor structure. The metal is then reacted with the underlying silicon regions to form a low resistance metal silicide. Any unreacted metal remaining on the substrate is then removed using a metal etch process that is selective to the remaining metal silicide.

During this process it is critical that the metal silicide is confined to the source/drain and gate regions. In the case of the source/drain regions, if the metal silicide forms under the transistor sidewall structures, the transistors could become inoperable. Furthermore the metal silicide layer should form a relatively smooth interface with the underlying source/drain region. Any unevenness in the metal silicide source/drain interface will lead to increased leakage currents and reduced breakdown voltages.

In order to reduce the resistances associated with the metal silicide regions, nickel is finding increasing use in forming the metal silicide regions in MOS transistors, particularly for transistors with physical gate lengths of less than 40 nm and/or MOS transistors with ultra-shallow junctions. Nickel has a very high diffusivity in silicon leading to the formation of nickel silicide regions that extend beneath the transistor sidewall structures. In addition, nickel silicide regions formed using existing methods have a very rough interface with underlying p-type source/drain regions. As described above, this results in transistors with higher leakage currents and reduced breakdown voltages.

There is therefore a need for a method to form metal silicide regions on the gate electrode and source/drain regions of a MOS transistor that have a smooth interface with the underlying source/drain region as well as not extend under the transistor sidewall structures.

SUMMARY OF THE INVENTION

To address the above-discussed deficiencies of the prior art, the present invention provides a method for manufacturing a semiconductor device, and a method for manufacturing an integrated circuit including the semiconductor device. The method for manufacturing a semiconductor device, among other steps, includes forming a gate structure over a substrate and forming source/drain regions in the substrate proximate the gate structure. The method further includes subjecting the gate structure and substrate to a dry etch process and placing fluorine in the source/drain regions to form fluorinated source/drains, subsequent to subjecting the gate structure and substrate to the dry etch process. Thereafter, the method includes forming metal silicide regions in the gate structure and fluorinated source/drains.

The method for manufacturing the integrated circuit, in addition to that discussed above, includes the step of forming interconnects within dielectric layers located over the substrate for electrically contacting the semiconductor devices. Additionally, the method includes forming a high performance capacitor over the gate structure, wherein the metal silicide region formed in the gate structure is used as a bottom electrode for the high performance capacitor.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGS. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

As physical gate lengths continue to decrease in metal-oxide-semiconductor (MOS) devices, especially those below the 40 nm level, certain obstacles must be overcome to continue using nickel as a metal silicide for contacting conventional source/drain regions. One of those obstacles, piping defects extending underneath the sidewall spacer of the semiconductor device, is believed to be a function of the relatively easy diffusion of nickel in silicon. Another of those obstacles, nickel di-silicide (NiSi$_2$) spike formations on p-type doped source/drain regions, is believed to be due in part to the NiSi$_2$ sites on the p-type doped silicon.

Given these obstacles, the present invention has recognized that applying a fluorine treatment to the silicon area where the nickel silicide is formed will ultimately substantially reduce the piping defects and effectively eliminate the nickel di-silicide (NiSi$_2$) spike formation. Unfortunately, the conventional dry etch pretreatment that immediately precedes the formation of the nickel silicide regions may not be performed, as it would reduce the effectiveness of the fluorine treatment. Nevertheless, without the conventional dry etch pretreatment, substantially higher sheet resistance results for narrow polysilicon gate electrode lines.

Accordingly, the present invention uniquely recognized that a dry etch pretreatment could be performed on the surface of the substrate as well as the gate structure prior to the fluorine treatment. Using this process flow, the semiconductor devices manufactured in accordance with the principles of the present invention would obtain the benefits associated with both the dry etch pretreatment and the fluorine treatment. Therefore, the use of the inventive methodology is capable of both reducing the piping defects and effectively eliminating nickel di-silicide spikes, while maintaining good sheet resistance for narrow polysilicon gate electrode lines. It is actually believed that this inventive methodology is critical for the success of integrating nickel silicide into complementary metal oxide semiconductor (CMOS) device flows.

Turning now to FIGS. 1-5, illustrated are cross-sectional views of detailed manufacturing steps instructing how one might, in an advantageous embodiment, manufacture a semiconductor device in accordance with the principles of the present invention. The partially completed semiconductor device 100 of FIG. 1 includes a substrate 110. The substrate 110 may, in an exemplary embodiment, be any layer located in the partially completed semiconductor device 100, including a wafer itself or a layer located above the wafer (e.g., epitaxial layer).

Figure 1:
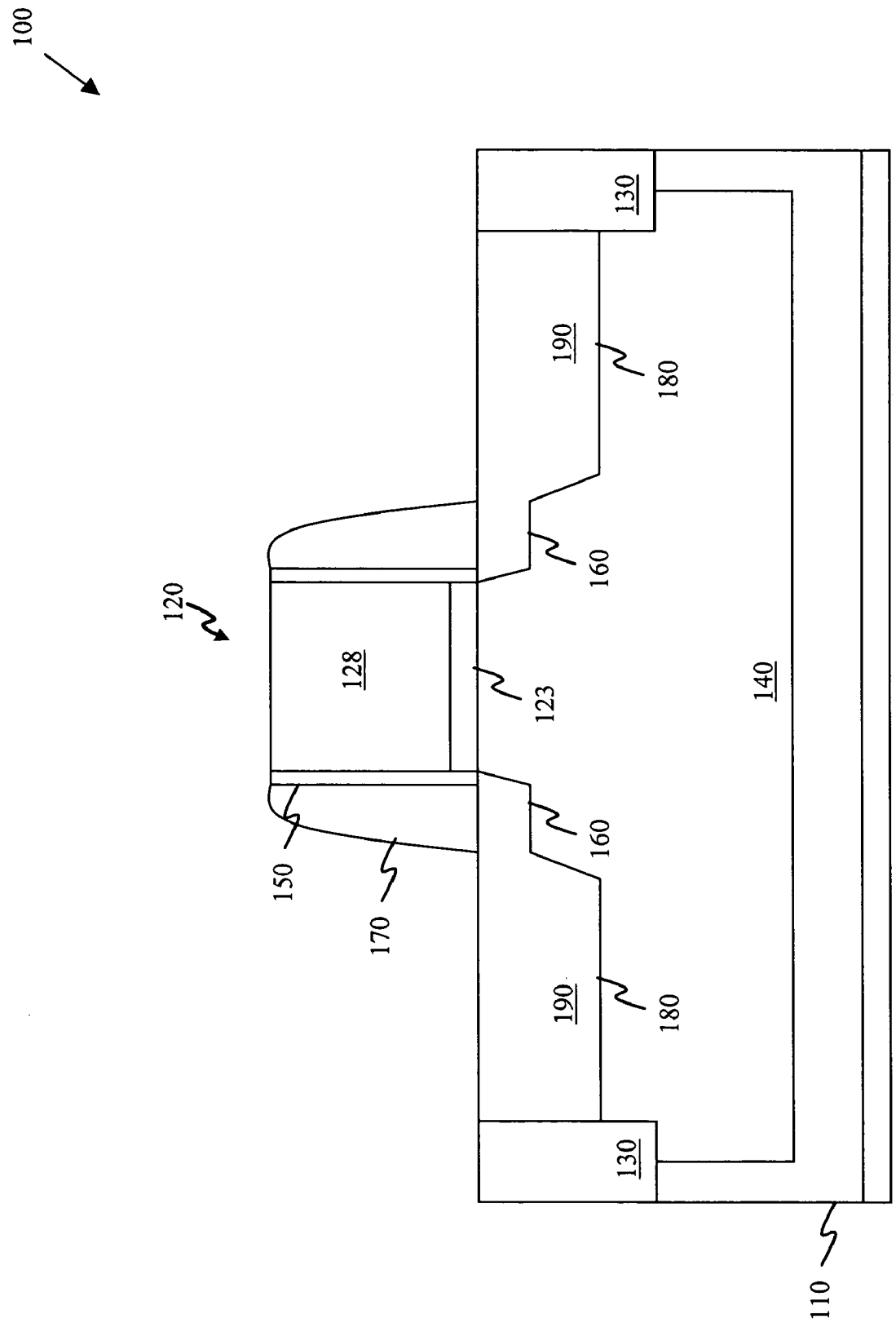
FIG. 1 illustrates a cross-sectional view of a partially completed semiconductor device manufactured in accordance with the principles of the present invention.

As is illustrated in FIG. 1, a gate structure 120 is formed over the substrate 110. The gate structure 120, in the embodiment shown, includes a gate dielectric layer 123 and a gate electrode layer 128. The gate dielectric layer 123 may, for example, comprise an oxide, thermally grown SiO$_2$, a nitride, an oxynitride, or any combination thereof, and preferably has a thickness ranging from about 1 nm to about 20 nm. The gate dielectric layer 123 can also be formed using a high K dielectric material with a dielectric constant greater than about 3.9. Some examples of high K dielectric material include hafnium containing dielectrics such as hafnium oxide, hafnium oxynitride, etc.

As previously indicated, the gate structure 120 further includes a gate electrode layer 128. The gate electrode layer 128 in one advantageous embodiment comprises a layer of silicon-containing material formed on the gate dielectric layer 123. Preferably, this silicon-containing material is comprised of polycrystalline silicon ("poly" or "polysilicon"), but it may comprise amorphous silicon, epitaxial silicon or any other semiconducting material.

Located within the substrate 110 and between isolation regions 130 is a well region 140. The well region 140 in the substrate 110 shown in FIGS. 1-5 can be either n-type or p-type. In forming CMOS integrated circuits, n-type and p-type well regions 140 are formed in the substrate 110. In the case of a p-well region an NMOS transistor will be formed. In a similar manner for an n-well region a PMOS transistor will be formed.

With the gate structure 120 defined using standard photolithography processes and polysilicon etching, a spacer 150 is formed, for example, by first thermally growing about 1 nm to about 5 nm of oxide followed by depositing about 15 nm of TEOS oxide. In other embodiments the spacer 150 can comprise a combination of silicon nitride and/or silicon oxide (either grown or deposited) layers.

For an NMOS transistor where the well region 140 comprises a portion of a p-type well, a blanket n-type lightly doped implant is performed resulting in the lightly doped extension implants 160. The n-type lightly doped extension implants 160 are often referred to as a lightly doped drain (LDD) or a moderately doped drain (MDD) extension regions. The n-type lightly doped extension implants 160 are conventionally formed and generally have a peak dopant concentration ranging from about 1E19 atoms/cm$^3$ to about 2E20 atoms/cm$^3$.

In addition to the n-type lightly doped extension implants 160, pocket implants (not shown) are sometimes performed. For the case where the semiconductor device 100 shown in FIG. 1 is an NMOS transistor, the pocket implant would comprise a p-type dopant species. In current integrated circuit technology, pocket implants refer to an implant that is used to reduce the effect of the short transistor gate length on transistor properties such as threshold voltage. The effect of the pocket implant is not however limited to threshold voltage. The pocket implant for a particular transistor type usually results in a doping profile that extends beyond the drain extension of the transistor. The species of the p-type pocket implant can consist of B, BF$_2$, Ga, In, or any other suitable p-type dopant. The species of the lightly doped extension implants 160 implant can consist of As, P, Sb, or any other suitable n-type dopant. The order of the implants is somewhat arbitrary and the lightly doped extension implants 160 could be performed before the pocket implant.

For a PMOS transistor where well region 140 comprises a portion of a n-type well, a blanket p-type lightly doped implant is performed resulting in p-type lightly doped extension implants 160. The p-type lightly doped extension implants 160 are also often referred to as a lightly doped drain (LDD) or a moderately doped drain (MDD) extension region. The p-type lightly doped extension implants 160 are conventionally formed and generally have a peak dopant concentration ranging from about 1E19 atoms/cm$^3$ to about 2E20 atoms/cm$^3$.

In addition to the p-type lightly doped extension implants 160, pocket implants are sometimes performed. For the case where the transistor shown in FIG. 1 is a PMOS transistor, the pocket implant would comprise an n-type dopant species. In current integrated circuit technology, pocket implants refer to an implant that is used to reduce the effect of the short transistor gate length on transistor properties such as threshold voltage. The effect of the pocket implant is not however limited to threshold voltage. The pocket implant for a particular transistor type usually results in a doping profile that extends beyond the drain extension of the transistor. The species of the n-type pocket implant can consist of As, P or any other suitable n-type dopant. The species of the p-type lightly doped extension implants 160 can consist of boron or any other suitable p-type dopant. The order of the implants is somewhat arbitrary and the pocket implant can be performed before the p-type lightly doped extension implants 160.

After the completion of the lightly doped extension implants 160 (and pocket implant if performed), and any subsequent processing, sidewall structures 170 are formed as shown in FIG. 1. In an embodiment of the instant invention, the sidewall structures 170 comprise a plurality of silicon oxide and silicon nitride dielectric layers. The sidewall structures 170 are formed by first depositing blanket layers of suitable dielectric material. An anisotropic etch is then used to form the sidewall structures 170. The sidewall structures 170 can also be formed using a single suitable dielectric material such as silicon nitride or silicon oxide.

Following the formation of the sidewall structures 170, highly doped source/drain implants 180 are formed. For an NMOS transistor, n-type dopants such as arsenic and/or phosphorous are implanted into the substrate 110 adjacent to the sidewall structures 170 to form the highly doped source/drain implants 180. For a PMOS transistor, p-types dopants such as boron are implanted into the substrate 110 adjacent to the sidewall structures 170 to form the highly doped source/drain implants 180. The highly doped source/drain implants 180 are conventionally formed and generally have a peak dopant concentration ranging from about 1E18 atoms/cm$^3$ to about 1E21 atoms/cm$^3$.

Following the formation of the highly doped source/drain implants 180, a high temperature source/drain anneal may be performed to activate the implanted dopants and remove the damage to the substrate 110 created during the ion implantation process. What results are source/drain regions 190. The source/drain anneal can comprise a rapid thermal annealing (RTA) process where the source/drain regions 190 are annealed at temperatures above 800° C. for times ranging from a second to minutes.

Figure 2:
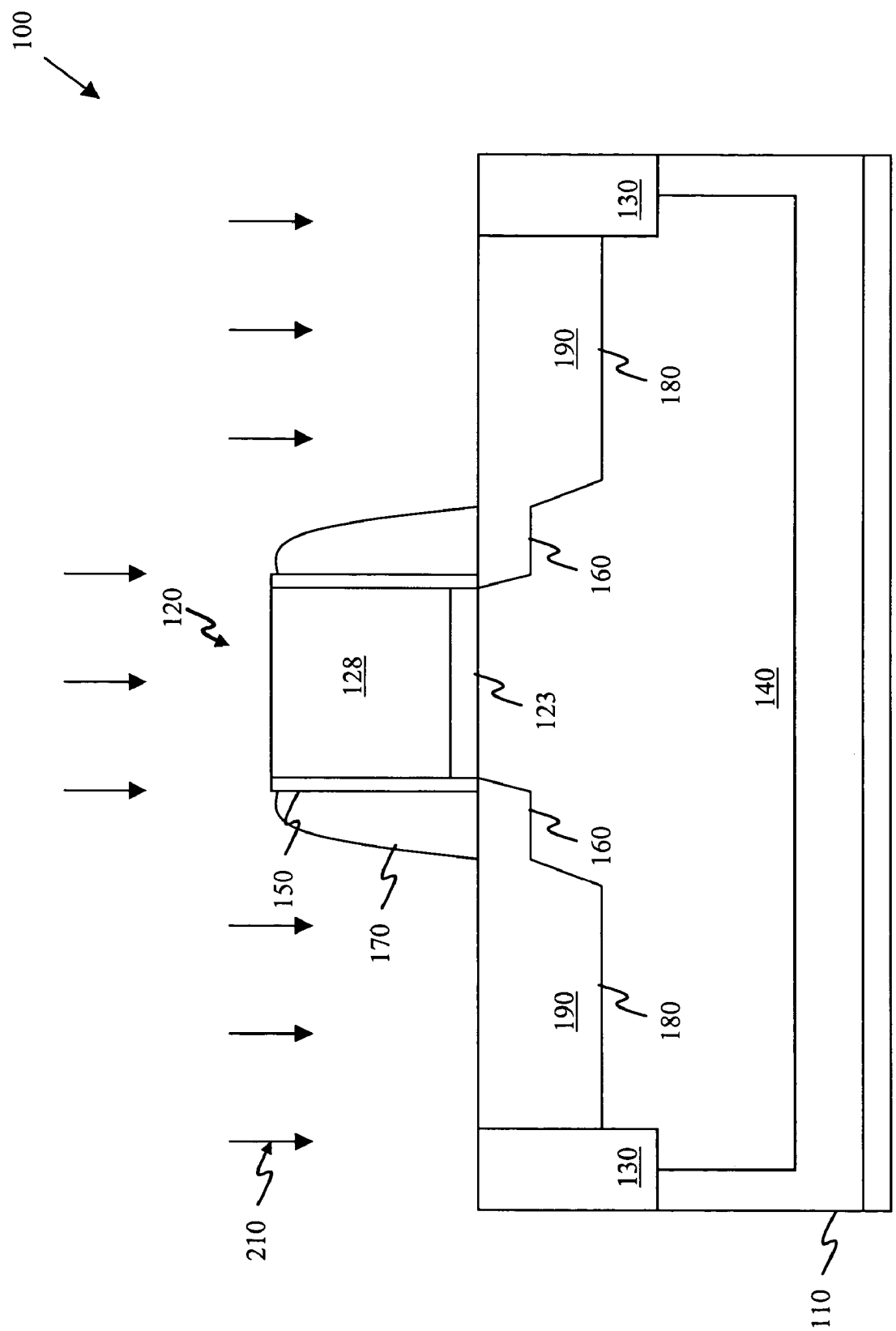
FIG. 2 illustrates a cross-sectional view of the partially completed semiconductor device illustrated in FIG. 1 after subjecting the gate structure and substrate to a dry etch process.

Turning now to FIG. 2, illustrated is a cross-sectional view of the partially completed semiconductor device illustrated in FIG. 1 after subjecting the gate structure 120 and substrate 110 to a dry etch process 210. The dry etch process 210, in an exemplary embodiment, comprises an argon plasma sputter etch. In this embodiment, the argon gas flow would desirably range from about 15 sccm to about 100 sccm. Additionally, the plasma chamber pressure would advantageously range from about 0.1 mtorr to about 50 mtorr and the power level would range from about 50 watts to about 100 watts. Additionally, an RF power of about 150 watts to about 450 watts may be applied to the wafer for bias. Other gases, flow rates, pressures and power levels could nonetheless be used.

In an alternative embodiment, the dry etch process 210 comprises an oxide dry etch process. The oxide dry etch could be any type of oxide dry etch, however, in an exemplary embodiment of the invention the oxide dry etch is similar to a conventional cap oxide etch used in the manufacture of semiconductor devices. This cap oxide etch typically uses plasma of gases containing C and F. In an exemplary embodiment, plasma of $CF_4$/$CHF_3$/Ar is used. Such a process can comprise flowing $CF_4$ at about 2 sccm to about 10 sccm, $CHF_3$ at about 5 sccm to about 25 sccm and Ar at about 50 sccm to about 100 sccm in a plasma chamber at pressures ranging from about 35 mtorr to about 100 mtorr and power levels ranging from about 100 watts to about 300 watts.

If the cap oxide etch were used, an optional oxygen ash and wet clean may be performed. In one embodiment, the wet clean could be an extensive hot SC1 clean (e.g., hydrogen peroxide, ammonium hydroxide and DI water). The extensive hot SC1 clean could be performed at a temperature ranging from about 50° C. to about 90° C. for a time period ranging from about 2 minutes to about 15 minutes. Other ashes and cleans are nevertheless within the scope of the present invention.

Figure 3:
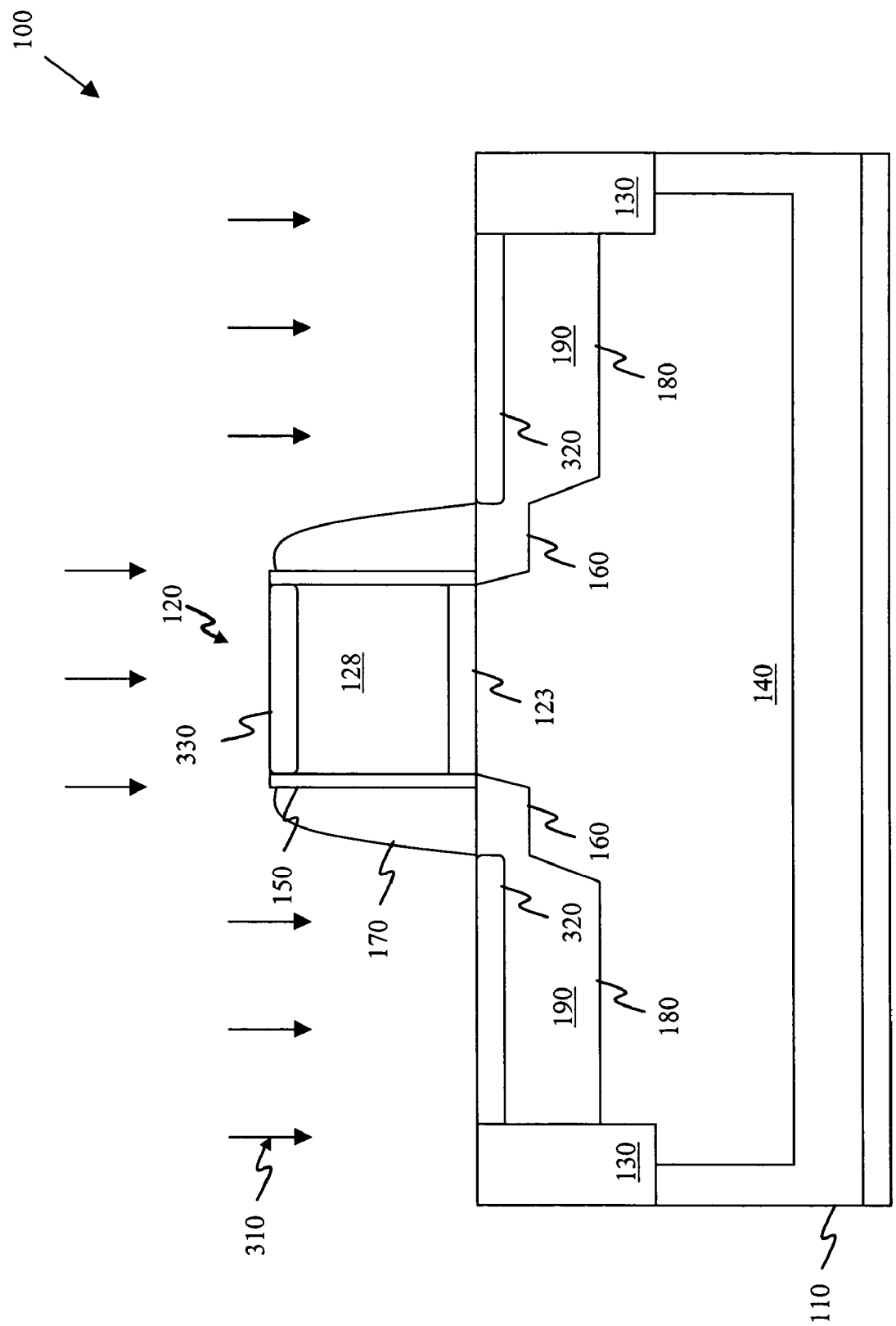
FIG. 3 illustrates a cross-sectional view of the partially completed semiconductor device illustrated in FIG. 2 after placing fluorine in the source/drain regions to form fluorinated source/drains.

Turning now to FIG. 3, illustrated is a cross-sectional view of the partially completed semiconductor device illustrated in FIG. 2 after placing fluorine 310 in the source/drain regions 190 to form fluorinated source/drains 320. It should be noted that the fluorinated source/drains 320 are formed after all the source/drain annealing processes have been completed. The fluorinated source/drains 320 are positioned near the surface of the substrate 110, with exemplary depths of around 0.5 nm to about 30 nm and fluorine concentrations ranging from about 1E17 atoms/cm$^3$ to about 5E21 atoms/cm$^3$.

In an embodiment, the fluorinated source/drains 320 are formed by exposing the source/drain regions 190 to a fluorine containing plasma. Such a process can comprising flowing $NF_3$ at about 0.2 sccm to about 20 sccm, $N_2$ at about 0 sccm to about 100 sccm, $H_2$ at about 0 sccm to about 100 sccm and/or Ar at about 0 sccm to about 100 sccm in a plasma chamber at pressures ranging from about 50 mtorr to about 100 mtorr and power levels ranging from about 75 watts to about 200 watts. Other gases that can be used in the plasma to form the fluorine containing region, without limitation, include $NF_3$/$H_2$, $NF_3$/$NH_3$, $NF_3$/$N_2$, $NF_3$/Ar, $NF_3$/$N_2$/$H_2$, $CF_4$/$H_2$/Ar, $C_2F_6$/Ar, and $C_2F_6$/$H_2$.

The fluorine containing plasma processes of the instant invention should be differentiated from other fluorine containing plasmas used to etch oxides and/or perform other types of surface treatments. These processes are optimized to not incorporate fluorine into the underlying silicon regions and in fact are optimized to leave no fluorine containing residue. The ability of fluorine to confine the formation of metal silicide regions was unknown prior to the instant invention and the formation of a near surface region of fluorine using plasmas is counter intuitive to the current uses of fluorine containing plasmas in the semiconductor arts.

In another embodiment of the instant invention, the fluorinated source/drains 320 can be formed by ion implanting fluorine and/or fluorine containing species into the source/drain regions 190 at energies ranging from about 0.2 KeV to about 5 KeV and doses ranging from about 1E10 atoms/cm$^2$ to about 1E16 atoms/cm$^2$. Those skilled in the art appreciate that choosing between the fluorine plasma process and the fluorine implantation process may require an analysis into the specific device being manufactured.

During the process of forming the fluorinated source/drains 320 in the source/drain regions 190, a fluorinated gate electrode region 330 may also be formed in the gate electrode layer 128. The fluorinated gate electrode region 330 in the gate electrode layer 128 will desirably assist in the subsequent formation of the nickel silicide layer that will be formed in the gate electrode layer 128. In those instances where no fluorinated gate electrode region 330 is desired in the gate electrode layer 128, a blocking layer or mask can be used to mask the gate electrode layer 128 during the fluorine incorporation process.

Figure 4:
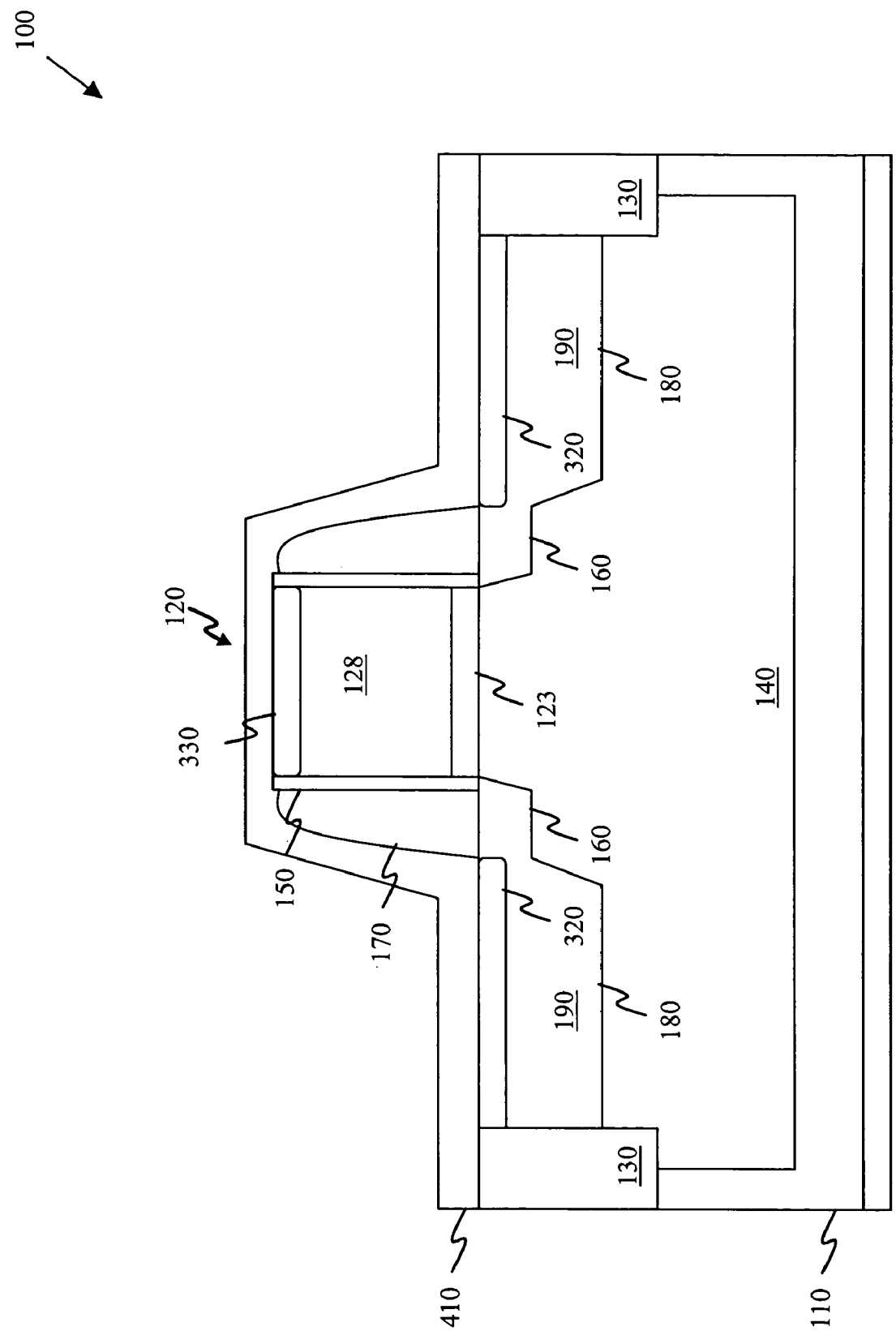
FIG. 4 illustrates a cross-sectional view of the partially completed semiconductor device illustrated in FIG. 3 after forming a metal layer over the gate electrode layer and source/drain regions.

Turning now to FIG. 4, illustrated is a cross-sectional view of the partially completed semiconductor device illustrated in FIG. 3 after forming a metal layer 410 over the gate electrode layer 128 and source/drain regions 190. In an embodiment of the instant invention the metal layer comprises nickel. In addition to nickel, other metals include cobalt, molybdenum, platinum, etc. For the case where nickel is used to form the metal layer 410, the thickness of the metal layer 410 is optimally between about 3 nm and about 40 nm. An optional cap layer (not shown), such as TiN, can be used to prevent potential adverse impact of ambient gas.

Figure 5:
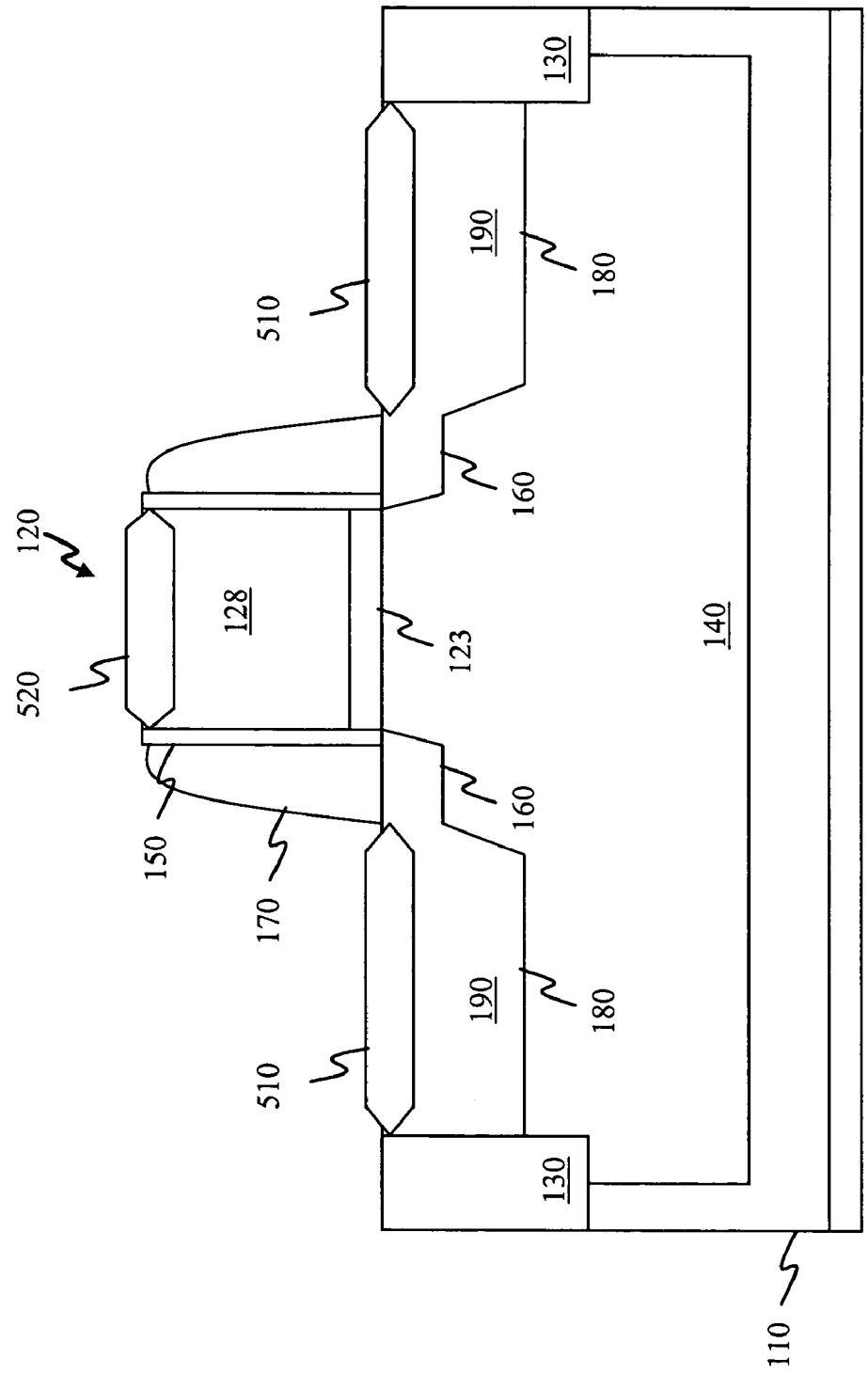
FIG. 5 illustrates a cross-sectional view of the partially completed semiconductor device illustrated in FIG. 4 after subjecting the metal layer to an anneal, thereby causing the metal layer to react with the underlying silicon regions to form metal silicide regions.

Turning to FIG. 5, illustrated is a cross-sectional view of the partially completed semiconductor device illustrated in FIG. 4 after subjecting the metal layer 410 to an anneal, thereby causing the metal layer 410 to react with the underlying silicon regions to form metal silicide regions 510, 520. It should be noted that no reaction takes place between the metal layer 410 and the sidewall structures 170. Following the formation of the metal silicide regions 510, 520, the unreacted metal is chemically removed resulting in a device similar to that shown in FIG. 5.

In the case where nickel is used to form the metal layer 410, nickel monosilicide (NiSi) is formed 510, 520, by annealing the nickel metal layer 410 at temperatures ranging from about 250° C. to about 550° C. In this embodiment, the fluorinated source/drains 320 will be at least partially, if not totally consumed during the silicide formation process. Additionally, there will typically be a pile-up of fluorine at the interface of the metal silicide regions 510 and the source/drain regions 190. Following the process of the instant invention, the measured fluorine concentration at the interface between the metal silicide regions 510 and the underlying source/drain regions 190 will advantageously range from about $1E17$ atoms/cm$^3$ to about $5E21$ atoms/cm$^3$. During the formation of the metal silicide regions 510 in the source/drain regions 190, a metal silicide region 520 may also be simultaneously formed in the gate electrode layer 128.

In some instances, the subjecting of the gate structure 120 and substrate 110 to the dry etch process, the formation of the fluorinated source/drains 320, and the subsequent formation of the metal layer 410 can be performed in-situ in multiple chambers of a single cluster tool or in a single chamber. Such a cluster tool may be purchased through Applied Materials, having the corporate address of 3050 Bowers Avenue, Santa Clara, Calif. 95054, under the Endura Mainframe name. It should be noted that the plasma sputter etch would be the best suited dry etch for this embodiment. It should also be noted that in this embodiment the optional clean steps disclosed herein need not be performed.

In those instances where the various processing steps are accomplished ex-situ, a second optional clean step may be required after the fluorine treatment and before forming the metal layer 410 on the substrate 110 and gate structure 120. This second optional clean step, among others, may include cleaning the surface with SC1 and hydrofluoric acid. It is believed that this second clean step also passivates the substrate 110 against air oxidation.

The above described metal silicide formation process can be used for both NMOS and PMOS transistors. In the case of NMOS transistors, the above described process minimizes the formation of metal silicide regions under the sidewall structures that extend to the channel regions, and results in a smooth metal silicide region 510 to source/drain region 190 interface. In the case of PMOS transistors, the above described process minimizes the unevenness in the metal silicide region 510 to source/drain region 190 interface and results in reduced leakage currents and increased breakdown voltages.

Figure 6:
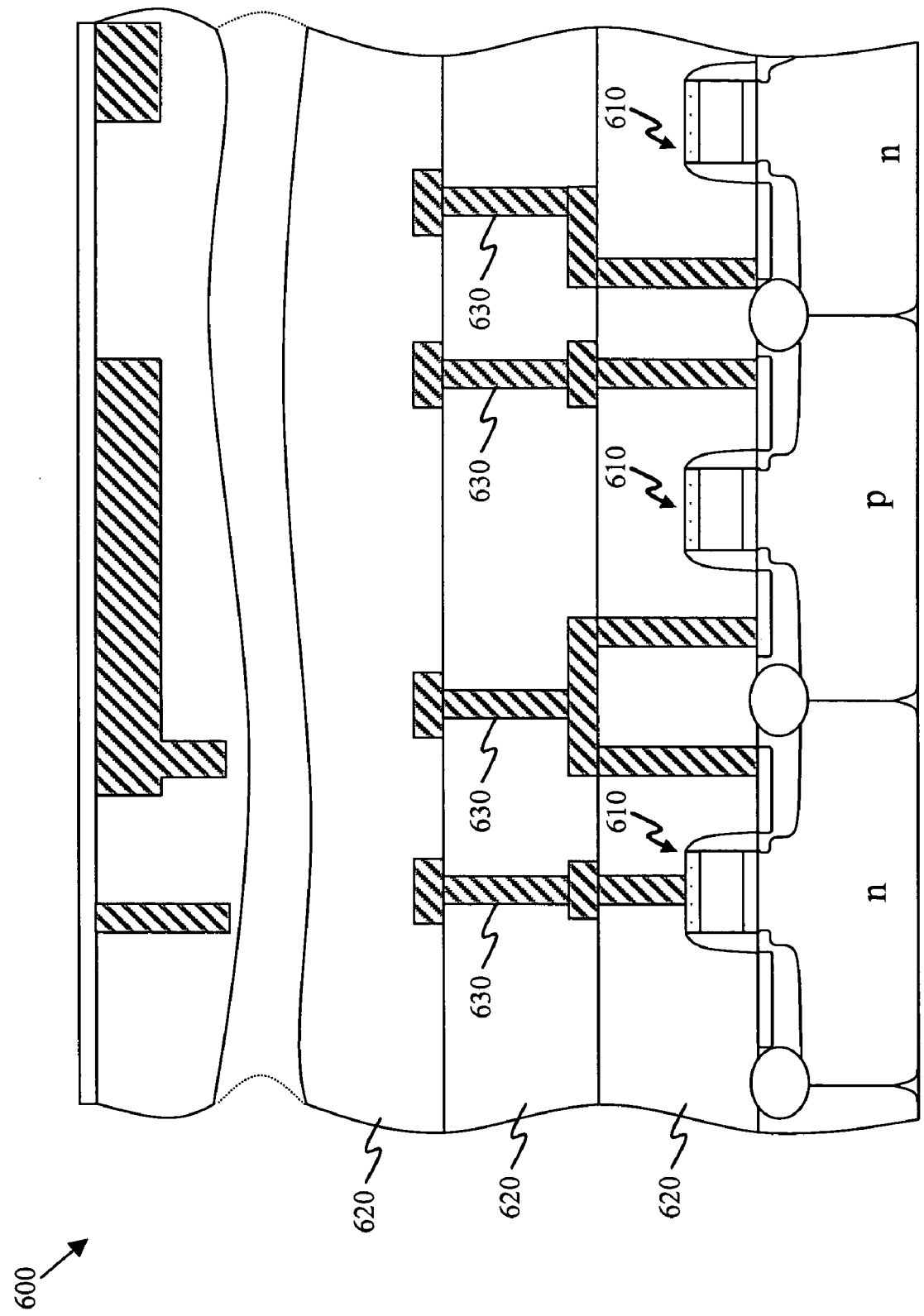
FIG. 6 illustrates a sectional view of a conventional integrated circuit (IC) incorporating a semiconductor device constructed according to the principles of the present invention.

Referring now to FIG. 6, illustrated is a sectional view of a conventional integrated circuit (IC) 600 incorporating a semiconductor device 610 constructed according to the principles of the present invention. The IC 600 may include devices, such as transistors used to form CMOS devices, BiCMOS devices, Bipolar devices, or other types of devices. The IC 600 may further include passive devices, such as inductors or resistors, or it may also include optical devices or optoelectronic devices. Those skilled in the art are familiar with these various types of devices and their manufacture. In the particular embodiment illustrated in FIG. 6, the IC 600 includes the semiconductor devices 610 having dielectric layers 620 located thereover. Additionally, interconnect structures 630 are located within the dielectric layers 620 to interconnect various devices, thus, forming the operational integrated circuit 600.

Figure 7:
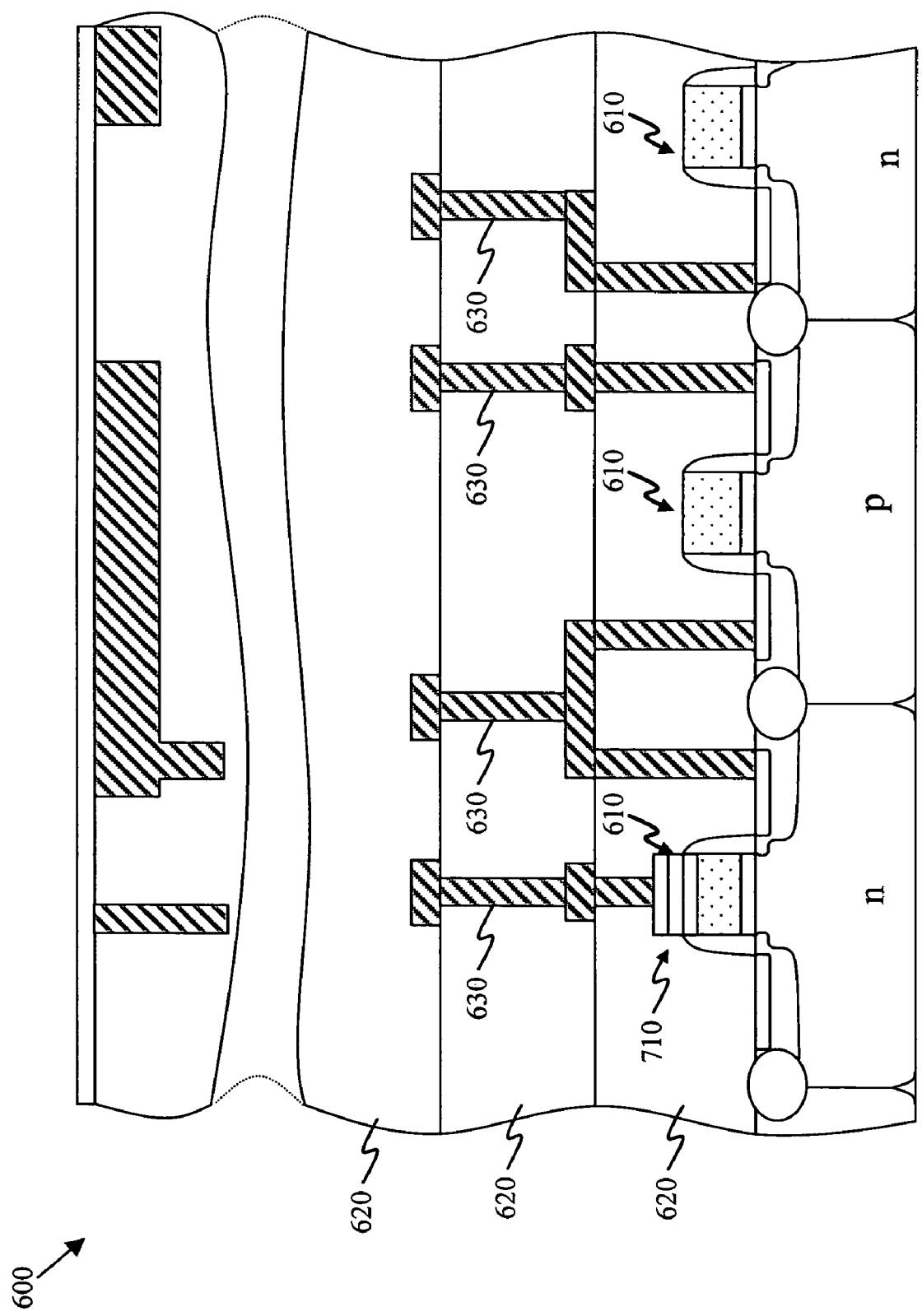
FIG. 7 illustrates a cross-sectional view of the IC illustrated in FIG. 6, however, the IC of FIG. 7 includes a capacitor located on at least one of the semiconductor devices.

Referring finally to FIG. 7, illustrated is a cross-sectional view of the IC 600 illustrated in FIG. 6, however, the IC of FIG. 7 includes a capacitor 710 located on at least one of the semiconductor devices 610. In the particular embodiment illustrated in FIG. 7, NiSi is formed on a poly gate electrode and used as a bottom electrode for the high performance capacitor 710. A dielectric layer (e.g., SiO$_2$) is then deposited on top of the NiSi bottom electrode, followed by a second electrode, such as TiN. The capacitor stack is then patterned to form the desirable capacitor 710.

Although the present invention has been described in detail, those skilled in the art should understand that they can make various changes, substitutions and alterations herein without departing from the spirit and scope of the invention in its broadest form.

What is claimed is:

1. A method for manufacturing a semiconductor device, comprising:
   forming a gate structure over a substrate;
   forming source/drain regions in the substrate proximate the gate structure;
   after forming source/drain regions, subjecting the gate structure and substrate to a dry etch process;
   placing fluorine in the source/drain regions to form fluorinated source/drains subsequent to subjecting the gate structure and substrate to the dry etch process; and
   forming metal silicide regions in the gate structure and in the fluorinated source/drains wherein forming metal suicide regions includes forming a metal layer over the gate structure and the fluorinated source/drains and reacting the metal layer with the gate structure and the fluorinated source/drains to form the metal silicide regions in the gate structure and the fluorinated source/drains.

2. The method as recited in claim 1 wherein subjecting the gate structure and substrate to a dry etch process includes subjecting the gate structure and substrate to an argon plasma sputter etch.

3. The method as recited in claim 1 wherein subjecting the gate structure and substrate to a dry etch process includes subjecting the gate structure and substrate to an oxide dry etch process, followed by an oxygen ash and a wet clean.

4. The method as recited in claim 1 wherein the fluorinated source/drains are formed by exposing the source/drain regions to a fluorine containing plasma comprising flowing NF$_3$ at about 0.2 sccm to about 20 sccm, N$_2$ at about 0 sccm to about 100 sccm, and H$_2$ at about 0 sccm to about 100 sccm in a plasma chamber at pressures of about 50 mtorr to about 100 mtorr and power levels of about 75 watts to about 200 watts.

5. The method as recited in claim 1 wherein the fluorinated source/drains are formed by ion implanting fluorine or a fluorine containing species into the source/drain regions at energies of about 0.2 KeV to about 5 KeV and doses of about $1E10$ atoms/cm$^2$ to about $1E16$ atoms/cm$^2$.

6. The method as recited in claim 1 further including cleaning the surface of the substrate after forming the fluorinated source/drains in the source/drain regions and before forming metal silicide regions in the fluorinated source/drains.

7. The method as recited in claim 1 wherein subjecting the gate structure and substrate to a dry etch process, forming fluorinated source/drains in the source/drain regions, and forming metal suicide regions in the gate structure and the fluorinated source/drains occur in the same process tool.

8. The method as recited in claim 1 wherein the metal silicide regions are nickel silicide regions.

9. The method as recited in claim 1 wherein the gate structure includes a polysilicon gate electrode layer and wherein forming metal silicide regions in the gate structure include forming metal silicide regions in the polysilicon gate electrode layer.

10. A method for manufacturing an integrated circuit, comprising:
creating semiconductor devices over a substrate, including:
forming a gate structure over the substrate;
forming source/drain regions in the substrate proximate the gate structure;
after forming source/drain regions, subjecting the gate structure and substrate to a dry etch process;
placing fluorine in the source/drain regions to form fluorinated source/drains subsequent to subjecting the gate structure and substrate to the dry etch process; and
forming metal silicide regions on the gate structure and fluorinated source/drains wherein forming metal silicide regions includes forming a metal layer over the gate structure and the fluorinated source/drains and reacting the metal layer with the gate structure and the fluorinated source/drains to form the metal silicide regions in the gate structure and the fluorinated source/drains; and
forming interconnects within dielectric layers located over the substrate for electrically contacting the semiconductor devices.

11. The method as recited in claim 10 wherein subjecting the gate structure and substrate to a dry etch process includes subjecting the gate structure and substrate to an argon plasma sputter etch.

12. The method as recited in claim 10 wherein subjecting the gate structure and substrate to a dry etch process includes subjecting the gate structure and substrate to an oxide dry etch process, followed by an oxygen ash and a wet clean.

13. The method as recited in claim 10 wherein the fluorinated source/drains are formed by exposing the source/drain regions to a fluorine containing plasma comprising flowing $NE_3$ at about 0.2 sccm to about 20 sccm, $N_2$ at about 0 sccm to about 100 sccm, and $H_2$ at about 0 sccm to about 100 sccm in a plasma chamber at pressures of about 50 mtorr to about 100 mtorr and power levels of about 15 watts to about 200 watts.

14. The method as recited in claim 10 wherein the fluorinated source/drains are formed by ion implanting fluorine or a fluorine containing species into the source/drain, regions at energies of about 0.2 Key to about 5 KeV and doses of about $1E10$ atoms/cm$^2$ to about $1E16$ atoms/cm$^2$.

15. The method as recited in claim 10 further including cleaning the surface of the substrate after forming the fluorinated source/drains in the source/drain regions and before forming metal silicide regions in the fluorinated source/drains.

16. The method as recited in claim 10 wherein subjecting the gate structure and substrate to a dry etch process, forming fluorinated source/drains in the source/drain regions, and forming metal silicide regions in the gate structure and fluorinated source/drains occur in the same process tool.

17. The method as recited in claim 10 wherein the metal silicide regions are nickel silicide regions.

18. The method as recited in claim 10 wherein the gate structure includes a polysilicon gate electrode layer and wherein forming metal silicide regions in the gate structure include forming metal silicide regions in the polysilicon gate electrode layer.

19. The method as recited in claim 10 further including forming a high performance capacitor in the gate structure, wherein the metal silicide region formed over the gate structure is used as a bottom electrode for the high performance capacitor.

20. A method for manufacturing a semiconductor device, comprising:
forming a gate structure over a substrate;
forming source/drain regions in the substrate proximate the gate structure;
after forming source/drain regions, subjecting the gate structure and substrate to a dry etch process;
placing fluorine in the source/drain regions to form fluorinated source/drains subsequent to subjecting the gate structure and substrate to the dry etch process;
cleaning the surface of the substrate subsequent to forming the fluorinated source/drains in the source/drain regions; and
forming metal silicide regions in the gate structure and in the fluorinated source/drains subsequent to cleaning the surface of the substrate, wherein forming metal silicide regions includes forming a metal layer over the gate structure and the fluorinated source/drains and reacting the metal layer with the gate structure and the fluorinated source/drains to form the metal silicide regions in the gate structure and the fluorinated source/drains.

* * * * *